US010086719B2

(12) United States Patent
Flamanc et al.

(10) Patent No.: US 10,086,719 B2
(45) Date of Patent: Oct. 2, 2018

(54) POWER SUPPLY SYSTEM FOR AN OVERHEAD CONTACT LINE

(71) Applicant: ALSTOM TRANSPORT TECHNOLOGIES, Saint-Ouen (FR)

(72) Inventors: Emmanuel Flamanc, Bois D'arcy (FR); Pierre Authie, Mareil Marly (FR)

(73) Assignee: Alstom Transport Technologies, Saint-Ouen (FR)

( * ) Notice: Subject to any disclaimer, the term of this patent is extended or adjusted under 35 U.S.C. 154(b) by 197 days.

(21) Appl. No.: 15/279,896

(22) Filed: Sep. 29, 2016

(65) Prior Publication Data

US 2017/0088015 A1    Mar. 30, 2017

(30) Foreign Application Priority Data

Sep. 30, 2015    (FR) ..................................... 15 59296

(51) Int. Cl.
*H01H 47/00* (2006.01)
*H01H 83/00* (2006.01)
(Continued)

(52) U.S. Cl.
CPC ................ *B60M 1/18* (2013.01); *B60M 3/00* (2013.01); *G01R 31/024* (2013.01); *G05B 9/02* (2013.01);
(Continued)

(58) Field of Classification Search
CPC . B60M 1/18; B60M 1/16; B60M 1/00; G01R 31/02; G01R 31/04; G01R 31/00;
(Continued)

(56) References Cited

U.S. PATENT DOCUMENTS 6,144,292 A * 11/2000 Brown ................ H02J 13/0027
340/12.33
6,154,488 A * 11/2000 Hunt ................... H02J 13/0024
340/12.33
(Continued)

FOREIGN PATENT DOCUMENTS

| EP | 1193109 A1 | 4/2002 |
|---|---|---|
| EP | 1550575 A1 | 7/2005 |
| JP | H06-16070 A | 1/1994 |

OTHER PUBLICATIONS

FR 1559296 Search Report dated May 20, 2016.

*Primary Examiner* — Rexford Barnie
*Assistant Examiner* — Jagdeep Dhillon
(74) *Attorney, Agent, or Firm* — Pearne & Gordon LLP

(57) ABSTRACT

This system for powering an overhead contact line, which includes a contact wire consisting of a plurality of conductive sections separated by insulating sections, includes power supply sub-stations, each conductive section being connected, on the side of an upstream end, to an upstream sub-station via an upstream controlled switch and, on the side of a downstream end, to a downstream sub-station via a downstream controlled switch. This system includes a detection device, associated with a conductive section, to be monitored, which includes a means for transmitting a characteristic signal to an upstream or downstream end of said conductive section and a receiving means able to receive the characteristic signal at the other end, the receiving means modifying the value of a state signal applied to a control circuit for actuating the opening of the downstream switch and/or of the upstream switch.

8 Claims, 4 Drawing Sheets

(51) Int. Cl.
  *H02J 7/00* (2006.01)
  *B60M 1/18* (2006.01)
  *G01R 31/02* (2006.01)
  *G05B 9/02* (2006.01)
  *G05B 11/01* (2006.01)
  *H02G 7/00* (2006.01)
  *H04B 3/54* (2006.01)
  *B60M 3/00* (2006.01)
  *B60M 1/22* (2006.01)

(52) U.S. Cl.
  CPC ............... *G05B 11/01* (2013.01); *H02G 7/00* (2013.01); *H04B 3/54* (2013.01); *B60M 1/22* (2013.01)

(58) Field of Classification Search
  CPC . G05B 9/02; G05B 11/01; H04B 3/54; H04B 3/56; H02G 7/00; H02G 7/02; H02G 7/06; G01V 3/02; G01V 3/08; G01V 3/10
  USPC ............... 307/125, 66, 64, 82, 80, 9.1, 10.1; 324/326, 322, 319, 329, 330
  See application file for complete search history.

(56) References Cited

U.S. PATENT DOCUMENTS

| | | | | |
|---|---|---|---|---|
| 2004/0110483 | A1* | 6/2004 | Mollenkopf | H04B 3/54 455/402 |
| 2010/0176814 | A1* | 7/2010 | Couture | G01R 31/085 324/521 |
| 2011/0103274 | A1* | 5/2011 | Vavik | H04B 3/54 370/293 |
| 2011/0130992 | A1* | 6/2011 | Kolwalkar | G01R 29/18 702/72 |
| 2013/0171606 | A1* | 7/2013 | Seymour | G09B 23/18 434/365 |
| 2013/0304406 | A1* | 11/2013 | Kim | G01R 31/083 702/59 |
| 2015/0077121 | A1* | 3/2015 | Branson | G01V 3/081 324/326 |

* cited by examiner

POWER SUPPLY SYSTEM FOR AN OVERHEAD CONTACT LINE

The present invention relates to systems for powering overhead contact lines.

An overhead line for electrically powering a vehicle is called an overhead contact line, when it only includes one or two contact wires. The latter are directly maintained at regular intervals by poles so as to be substantially horizontal.

An electric power supply overhead line is called a catenary when it consists of one or two contact wires suspended by pendulums to one or two supporting cables. The supporting cable is itself maintained, at regular intervals, by poles. The supporting cable, under the effect of its own weight, assumes the shape of a catenary and the pendulums have suitable heights so that the contact wire is suspended substantially horizontally.

The electric vehicle is then powered by capturing the current circulating on the contact wire by means of a pantograph mounted on the roof of the vehicle and deployed so as to come into contact with the contact wire.

In the present document, by electric vehicle is meant any vehicles capable of capturing current on such an overhead contact line. For example this is a guided electric vehicle (train, tramway, etc.) or a non-guided vehicle (trolley bus, car, etc.)

The breaking of the contact wire of an overhead contact line is a dangerous accident, which notably occurs on level crossings or by melting at the pantograph of a stopped train.

Now, once it is broken, the contact wire hangs or falls to the ground. As it is brought to a high potential, it then has an important risk of electrocution for persons found in the area in the vicinity of the breaking point.

The object of the invention is therefore to surmount this problem.

For this purpose, the object of the invention is a system for powering an overhead contact line, the line including at least one contact wire consisting of a plurality of conductive sections separated from each other by insulating sections, the system including a plurality of electric power supply sub-stations, each conductive section being connected, on the side of an upstream end of said conductive section, to an upstream sub-station via a upstream controlled switch and on the side of a downstream end of said conductive section, to a downstream sub-station via a downstream controlled switch, each controlled switch being actuated by a corresponding control circuit, characterized in that the system further includes a detection device associated with a conductive section to be monitored and to an emission means able to apply a characteristic signal to an end from among the upstream end and the downstream end of said conductive section and a receiving means able to receive the characteristic signal at the other end of said conductive section, the receiving means being able to modify the value of a state signal and to apply it at least to a control circuit for actuating the opening of the downstream switch and/or of the upstream switch.

In this powering system, means are provided which allow detection of the breakage of a contact wire and immediate interruption of the electric power supply of the contact wire.

According to other advantageous aspects of the invention, the powering system comprises one or several of the following features, taken individually or according to all the possible technical combinations:

- the device for detecting an associated conductive section includes an upstream transceiver module coupled with the upstream end and a downstream transceiver module coupled with the downstream end of the conductive section; the upstream transceiver module including an upstream emission means able to apply a characteristic signal to the upstream end; the downstream transceiver module including a downstream emission means able to apply a characteristic signal to the downstream end; the upstream transceiver module including an upstream receiving means able to receive the characteristic signal of the downstream transceiver module and to modify the value of an upstream state signal applied to an upstream control circuit for actuating the opening of the upstream switch; the downstream transceiver module including a downstream receiving means able to receive the characteristic signal of the upstream transceiver module and of modifying the value of a downstream state signal applied to a downstream control circuit for actuating the opening of the downstream switch.
- the upstream transceiver module applies the state signal to the downstream control circuit to which it is connected through a suitable control link, and in that the downstream transceiver module applies the state signal to the upstream control circuit to which it is connected through the suitable control link.
- the characteristic signal applied by the transceiver modules is a current, the downstream and upstream transceiver modules being coupled with the conductive section to be monitored via a capacitor so as to superpose said characteristic signal to the power supply current of said conductive section.
- each characteristic signal is frequency-modulated at a characteristic frequency.
- the receiving means of each of the downstream and upstream transceiver modules includes a band pass filter centered on the characteristic frequency.
- a control switch for circumventing a sub-station allowing, in the closed state, the connection of two successive conductive sections with each other, the state signal modified by at least one of the downstream or upstream transceiver modules associated with a first conductive section being transmitted to a control circuit of a switch for connecting the second conductive section to another sub-station.
- a control central unit able to collect the state signals applied to the different upstream and downstream control circuits of the power supply system for updating a representation of said system.
- for an overhead contact line including first and second contact wires, two conductive sections respectively belonging to the first and to the second wires and positioned parallel to each other being connected in parallel between an output terminal of an upstream sub-station and an output terminal of a downstream sub-station, the system including a detection device for each of said two conductive sections.
- an upstream end, respectively downstream end of each of said two conductive sections, are connected to a common upstream control switch, respectively to a common downstream control switch.

The invention will be better understood by means of the description which follows, only given as a non-limiting example and made with reference to the appended drawings wherein.

Figure 1:
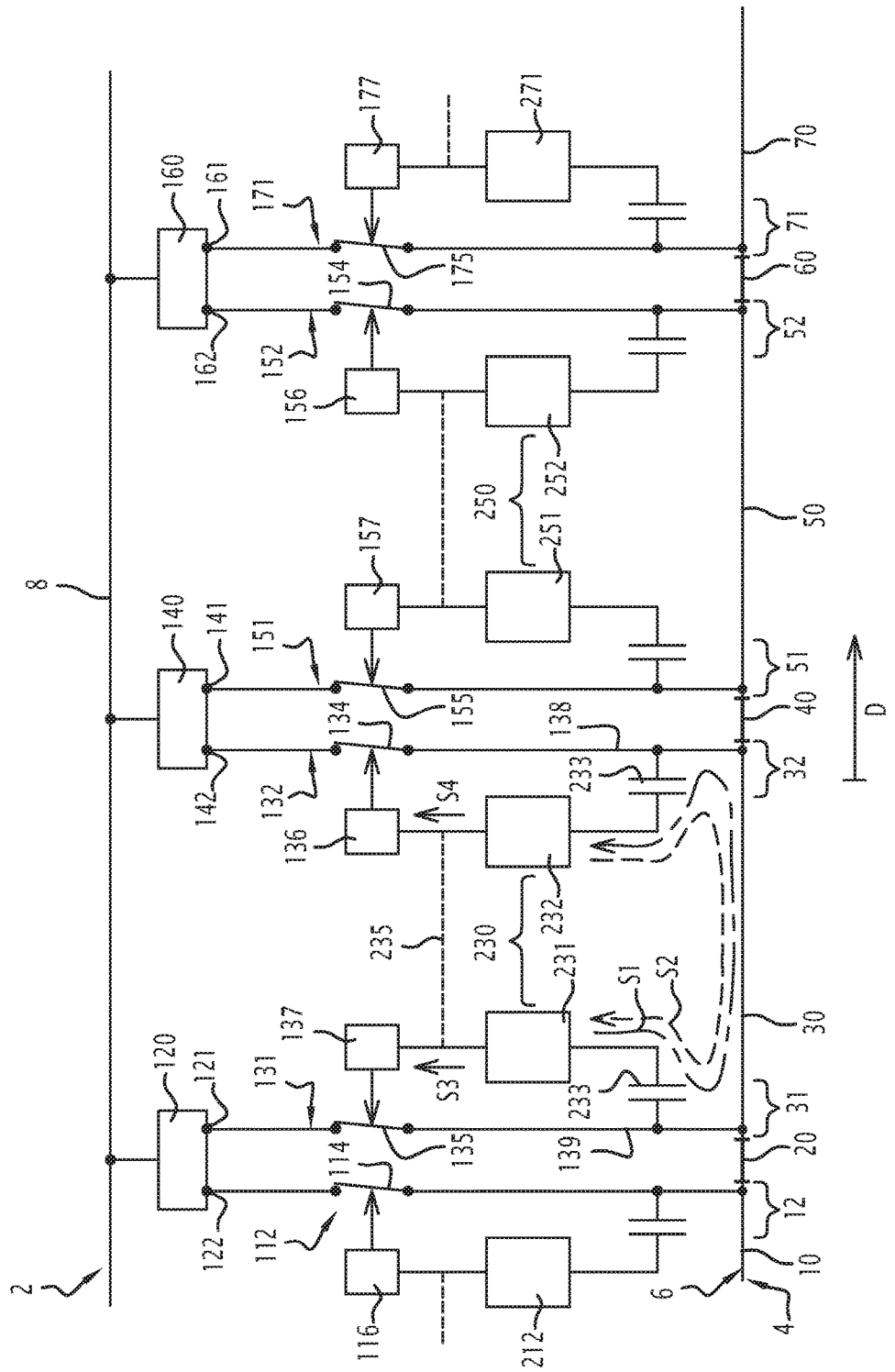
FIG. 1 is a schematic representation of a first embodiment of a power supply system for an overhead contact line including a single contact wire, in a state in which the contact wire is straightforward.
Figure 2:
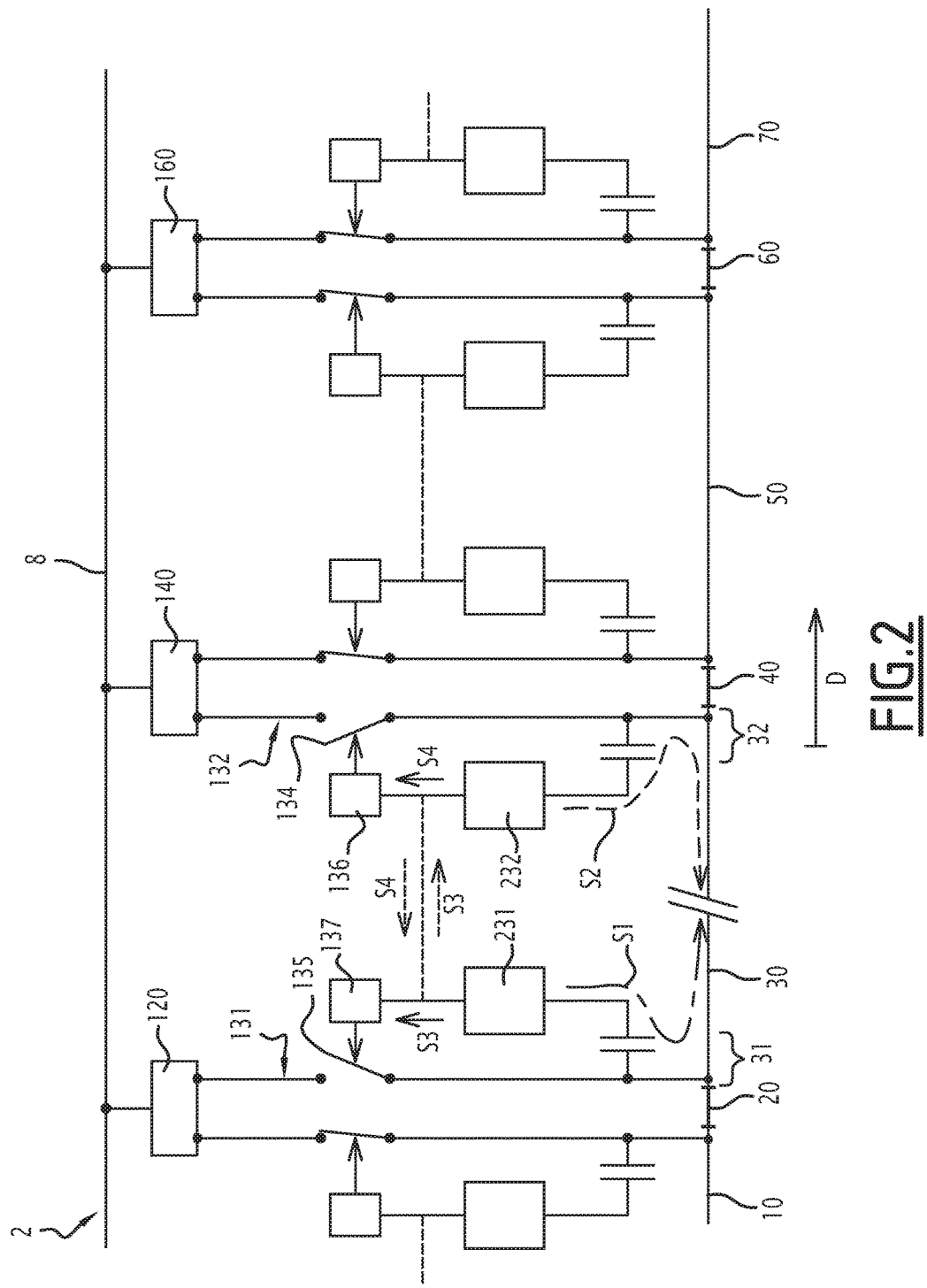
FIG. 2 is similar to FIG. 1, the system being in a state in which the contact wire is broken.

FIGS. 1 and 2 represent a power supply system 2 for an overhead contact line 4.

For example this is an overhead contact line 4 positioned vertically below a railway track, along which circulate guided electric vehicles. Each vehicle is equipped with a pantograph, mounted on the roof, able to come into contact with the line 4, brought to a high potential, in order to capture the electric power required for its propulsion.

In the first embodiment of FIGS. 1 and 2, the line 4 includes a single contact wire 6.

The wire 6 consists of a plurality of conductive sections, separated from each other by insulating sections. In FIGS. 1 and 2, the conductive sections 10, 30, 50 and 70 are insulated by insulating sections 20, 40 and 60.

More particularly, the intermediate conductive section 30 is separated from an upstream conductive section 10 via an insulating section 20 and a downstream conductive section 50, by an insulating section 40.

The adjectives of upstream and of downstream are relative to an arbitrary direction D of the railway track above which the wire 6 is tensioned.

The system 2 includes a high voltage power supply network 8, which is connected to an electric transport network belonging to a current provider operator. The network 8 is for example covered by an alternating current for which the useful voltage is high, typically 20,000 V.

The system 2 includes a plurality of power supply sub-stations, identical with each other and connected to network 8.

In FIG. 1, sub-stations 120, 140 and 160 are illustrated.

A sub-station has the function of converting the high voltage alternating current of the network 8 into a low voltage DC current, typically of 750 V.

The power supply of each conductive section of the wire 6 is achieved by connecting an upstream end of this conductive section to an upstream sub-station and a downstream end of this conductive section to a downstream sub-station.

Thus, for example, the upstream end 31 of the section 30 is connected to an output terminal 121 of the upstream sub-station 120, while the downstream end 32 of the section 30 is connected to an output terminal 142 of the downstream sub-station 140.

The upstream sub-station 120 includes another output terminal 122 connected to the downstream end 12 of the conductive section 10. The downstream sub-station 140 includes another output terminal 141 connected to the downstream end 51 of the conductive section 50.

A connection branch between a sub-station and a conductive section includes in series, from the output terminal of the sub-station towards the end of the relevant conductive section, a means for insulating the sub-station, such as a controlled switch, controlled by a control circuit, and a connecting wire connected to the end of the conductive section.

Thus, the branch 131 between the sub-station 120 and the downstream end 31 of the conductive section 30 includes, from the terminal 121, a controlled switch 135, which is controlled by a control circuit 137, and a connecting wire 139 electrically connected to the downstream end 31 of the conductive section 30.

Similarly, at the other end 32 of the conductive section 30, the branch 132 includes, from the terminal 142 of the sub-station 140, a controlled switch 134, which is controlled by a control circuit 136, and a connecting wire 138 connected to the end 32 of the conductive section 30.

Similar descriptions may be made of the branches 112, 151, 152 and 171 illustrated in FIGS. 1 and 2.

For detecting the breaking of the conductive wire 6, the system 2 is equipped with a plurality of detection devices. Each detection device is dedicated to the monitoring of an associated conductive section. Thus, for example, the system 2 includes a detection device 230 for determining at each instant, the integrity of the conductive section 30.

Each detection device includes a pair of transceiver modules positioned at each end of the associated conductive section. The device 230 thus includes an upstream transceiver module 231 on the side of the upstream end 31 of the associated conductive section 30, and a downstream transceiver module 232 on the side of the downstream end 32 of the associated conductive section 30.

A transceiver module is coupled, via a capacitor, to the connecting wire of the branch connected to the corresponding end of the associated conductive section. Moreover, a transceiver module is connected, via a control line, to the circuit for controlling the switch of the branch connected to the corresponding end.

Thus, in our example, the upstream transceiver module 231 is coupled, via a capacitor 233, with the connecting wire 139 connected to the upstream end 31 of the conductive section 30. Moreover it is connected, through a control line, to the control circuit 137 of the upstream switch 135.

Similarly, the downstream transceiver module 232 is coupled, via a capacitor 233, with the connecting wire 138 connected to the downstream end 32 of the conductive section 30. It is connected through a control line, to the control circuit 136 of the downstream switch 134.

A transceiver module includes a transmitter able to periodically generate a characteristic signal and to transmit it along the associated conductive section.

The characteristic signal is a current signal having a characteristic frequency f0, for example in the range from 100 to 2,000 Hz.

The characteristic signal is transmitted permanently.

A transceiver module includes a receiver able to measure the current on the connecting wire with which it is coupled and of filtering it. The filter of the receiver of a transceiver module is of the band pass filter type centered on the frequency f0.

At the output of the filter, the receiver includes a comparator able to compare the filtered signal with a reference threshold. When the filtered signal is greater than or equal to this threshold, the comparator generates a state signal with the value of <<1>>. When the filtered signal is less than this threshold, the comparator generates a state signal of value "0".

At the outlet of the receiver, the state signal is applied, via the control line, to the control circuit of the corresponding switch.

Thus, for example, the upstream module 231 permanently transmits a characteristic signal S1. By means of the capacitor 233, the signal S1 is applied to the end 31 in superposition of the power supply current applied to this same end by the downstream sub-station 120.

When the conductive section 30 is straightforward, as this is illustrated in FIG. 1, the signal S1 propagates as far as the downstream end 32 of the conductive section 30 and the connecting wire 138.

There, the receiver of the downstream module 232 extracts from the measured current on the connecting wire 138, the characteristic signal S1. The comparator of the receiver of the module 232 then maintains the state signal S4 to the value "1" and applies it to the control circuit 136.

Symmetrically, the downstream module 232 periodically transmits a characteristic signal S2. By means of the capacitor 233, the signal S2 is applied to the end 32 in superposition to the power supply current applied to this same end by the downstream sub-station 140.

When the conductive section 30 is straightforward, the signal S2 propagates as far as the upstream end 31 and the connecting wire 139.

The receiver of the upstream module 231 extracts from the current measured on the connecting wire 139, the characteristic signal S2. The comparator of the receiver of the upstream module 231 then maintains the state signal S3 to the value of "1" and applies it to the control circuit 137 of the switch 135.

On the other hand, when the conductive section 30 is broken, as this is illustrated in FIG. 2, the characteristic signal S1 transmitted by the upstream module 231, respectively S2 transmitted by the downstream module 232, does not arrive as far as the receiver of the other module, i.e. the downstream module 232, respectively the upstream module 231.

The comparator of the receiver of the downstream module 232 no longer detecting the signal S1 then switches the value of the state signal S4 to the value of "0".

Symmetrically and substantially at the same instant, the comparator of the receiver of the upstream module 231 no longer detecting the signal S2 switches the value of the state signal S3 to the value of "0".

A control circuit, such as the circuits 137 and 136, is a logic circuit able to take into account different constraints, expressed in the form of the different state signals which are applied to it, in order to place the switch which it controls into the open or closed state.

In particular, during a change of state of the state signal from a transceiver module, the value of the state signal switching from "1" to "0", the control circuit actuates the opening of the switch which it controls so as to interrupt the power supply between the sub-station and the corresponding conductive section.

Thus, as soon as the conductive section 30 is broken, the characteristic signal S1 is no longer received by the downstream module 232, which switches the value of the state signal S4 from "1" to "0". Accordingly, the control circuit 136 actuates the opening of the switch 134. The branch 132 is open and the section 30 is insulated from the downstream sub-station 140.

Symmetrically, the characteristic signal S2 is no longer received by the downstream module 231, which switches the value of the state signal from "1" to "0". Accordingly, the control circuit 137 actuates the opening of the switch 135. The branch 131 is open and the section 30 is insulated from the upstream sub-station 120.

Accordingly, the section 30 is no longer powered. Therefore it does have no longer any risk for the installations or persons located nearby.

In an alternative embodiment of the first embodiment, each control circuit 137, 136, is connected not only to the transceiver module located on its side of the monitored conductive section, but also to the transceiver module located on the opposite side.

This is illustrated in FIGS. 1 and 2 by the control link 235, illustrated in dashed lines, between the control links from the upstream module 231 and from the downstream module 232.

Thus, in this alternative, a control circuit, such as the upstream control circuit 137 may take into account not only the state signal S3 transmitted by the upstream module 231, but also the state signal S4 generated by the downstream module 232. Symmetrically, the downstream control circuit 136 is capable of taking into account not only the state signal S4 transmitted by the downstream module 232, but also the state signal S3 generated by the upstream module 231.

A control circuit is for example configured for opening the switch which it controls as soon as one of the state signals which it receives changes level. This gives the possibility of increasing the time reactivity of the system 2 and of rapidly insulating the faulty conductive section as soon as the breaking of the contact wire is detected by either one of the two modules of the detection device.

Figure 3:
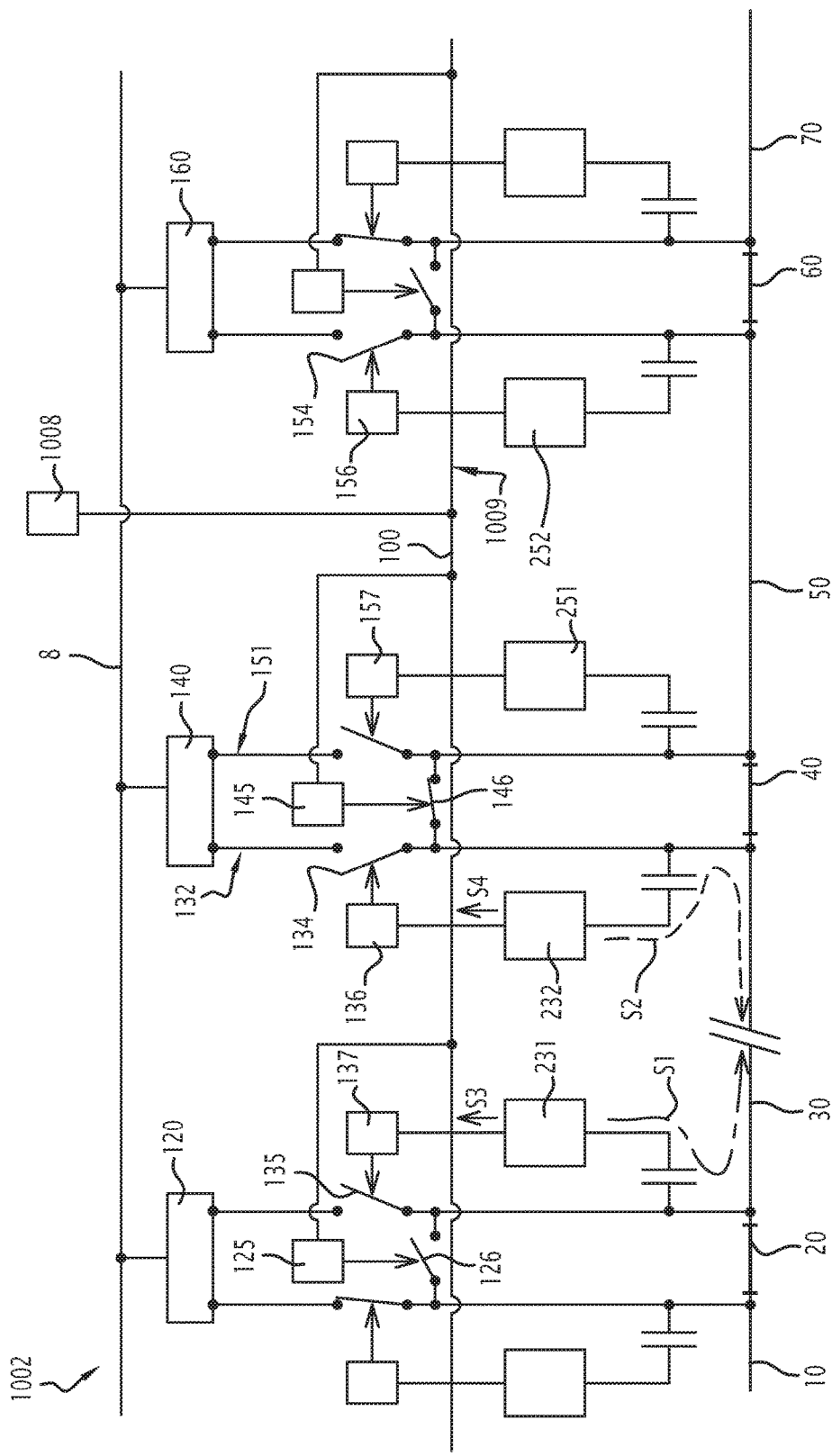
FIG. 3 is a schematic representation of a second embodiment of a power supply system, in which a power supply sub-station may be circumvented in the case of malfunction; and, FIG. 4 is a schematic representation of a third embodiment of a power supply system, for an overhead contact line including two contact wires.

In FIG. 3, a second embodiment of a power supply system is illustrated. In this figure, the reference figures used for identifying a component are the same as those used for identifying this same component in FIGS. 1 and 2.

This system 1002 gives the possibility of electrically connecting two successive conductive sections in the case of a malfunction of the power supply sub-station which is common to them. For example, in the case of a malfunction of the sub-station 140, a control circuit 145 closes a switch 146 so as to connect together the connecting wires of the branches 132 and 151, i.e. electrically connecting the conductive sections 30 and 50 with each other. The sub-station 140 is thus circumvented.

The group consisting of the conductive sections connected with each other is powered by an upstream sub-station and a downstream sub-station, the sub-stations 120 and 160 in FIG. 3.

In the system 1002, the control circuits of the different switches are connected to a network 1009. The state signals relative to the detection by a transceiver module of the associated conductive section, as well as the state signals relative to the state of the sub-stations may then be propagated and taken into account by a remote control circuit.

Thus, during the breaking of the conductive section 30, the downstream transceiver module 232 no longer receiving the signal S1 from the upstream transceiver module 231, switches the value of the state signal S4 from the value "1" to the value "0". This state signal S4 is propagated along the network 1009 towards the control circuit 156 for controlling the switch 154.

The circuit 156 is configured so as to take into account the change in value of the state signal S4 as soon as the state signal of the circuit 145 indicates that the switch 146 for circumventing the sub-station 140 is closed. Accordingly, the circuit 156 actuates the opening of the switch 154.

Simultaneously, the upstream transceiver module 231 no longer receiving the signal S2 from the downstream transceiver module 232, switches the value of the state signal S3 from the value "1" to the value "0". This state signal S3 is transmitted over the network 1009.

The circuit 137 is configured for taking into account the change in the value of the state signal S3 as soon as the state signal of the circuit 125 indicates that the switch 126 for circumventing the sub-station 120 is open. Accordingly, the circuit 137 actuates the opening of the switch 135.

Accordingly, as soon as a conductive section of a group of conductive sections is broken, the whole of the group of conductive sections is insulated from the upstream and downstream power supply sub-stations of the sections of this group.

In an alternative, which is not specific to this second embodiment, a control central unit 1008 is able to collect the state signals circulating on the network 1009 in order to keep a representation of the system 1002, updated, for example giving the possibility to an operator of following the instantaneous state of the system 1002. Through his central unit, the operator may transmit state signals towards such or such control circuit, for example for putting back into a default state the switch controlled by this control circuit.

It is also possible to add that by means of the control central unit 1008, it is possible to determine the localization of the failure of the "contact breakage of the line" type failure and thus facilitate maintenance.

Figure 4:
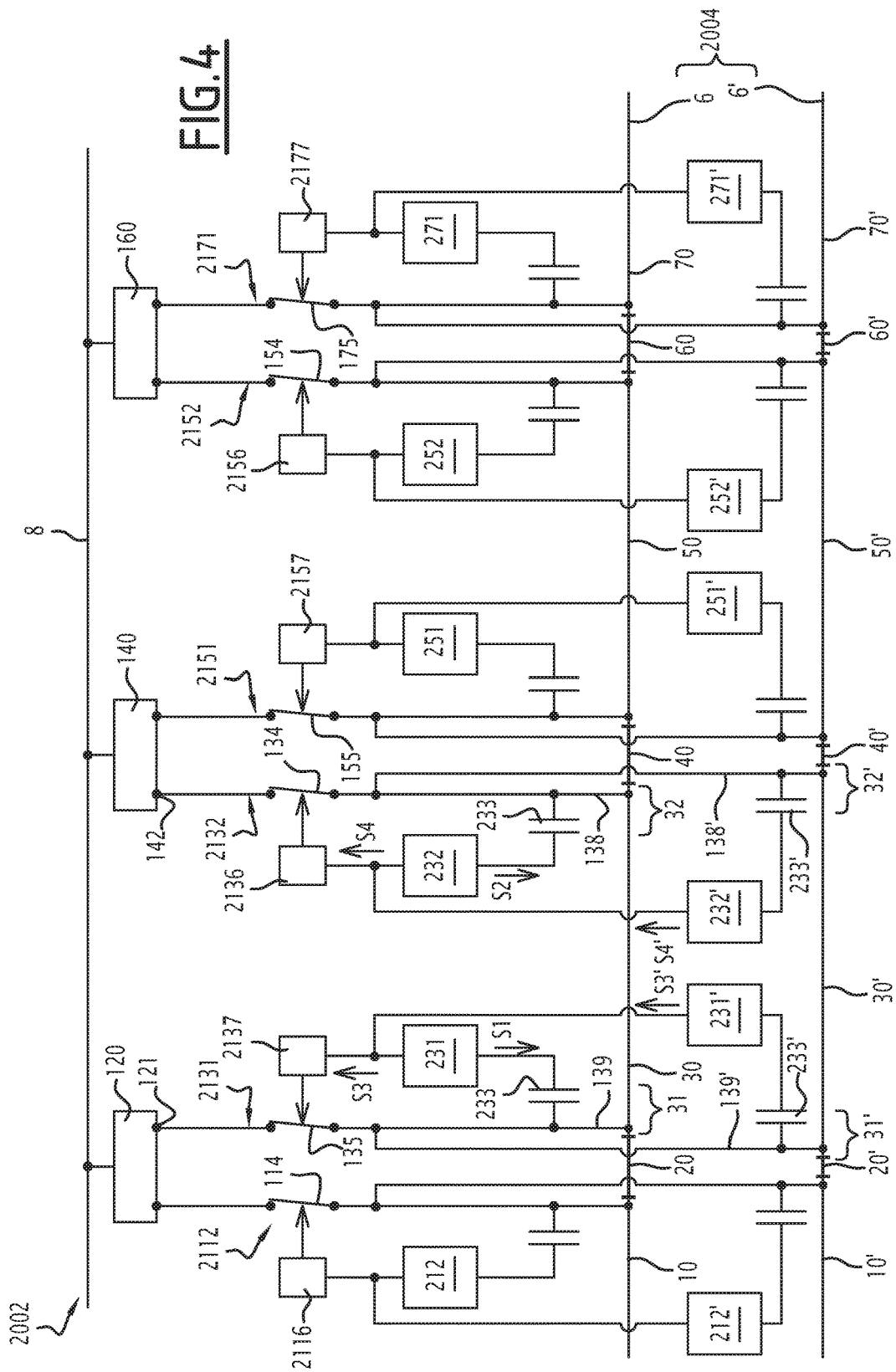

In FIG. 4, a third embodiment of a power supply system 2006 is illustrated, dedicated to the case of an overhead contact line 2004 including two contact wires.

In this figure, the reference figures used for identifying an identical component with a component of FIG. 1 are the same as those used for identifying this identical component in FIG. 1. The reference figures used for identifying a component identical with a component of FIG. 1 but associated with the second wire are the same as those used for identifying this identical component in FIG. 1, but primed. Finally, the reference figures used for identifying a similar component with a component of FIG. 1 are the same as those used for identifying this similar component in FIG. 1, but increased by two thousand.

The overhead contact line 2004 comprises two contact wires 6 and 6', which are positioned parallel above the track. The subdivision into conductive and insulating sections of each of the wires is spatially identical.

A sub-station is connected in parallel to the end of the conductive section of the first wire 6 and to the end of the conductive section of the second wire 6'. Preferably, two connecting wires, such as wires 139 and 139', are connected to the controlled switch, such as the switch 135, of the relevant branch, such as branch 2131.

Each connecting wire is coupled with a transceiver module able to emit and receive a characteristic signal along the associated conductive section, in order to detect any discontinuity in the propagation of the characteristic signals.

In this third embodiment, a circuit for controlling a switch takes into account the state signal transmitted by each of the transceiver modules coupled with the connecting wires of this branch. For example, the control circuit 2137 of the branch 2131 takes into account the state signal S3 generated by the module 231 as well as the state signal S3' generated by the module 231'.

As soon as one of the two state signals changes level, the control circuit is able to control the opening of the correspondent switch.

The opening of the switch gives the possibility of insulating both conductive sections, i.e. both the conductive section for which a discontinuity has been detected, but also the conductive section of the other wire, positioned in parallel, so as to ensure the safety of the installation.

In this third embodiment, the circuits for controlling the switches are connected with each other for exchanging state signals. Their logics are therefore adapted so as to take into consideration these state signals in an appropriate way.

Like in the second embodiment, means may be applied for allowing electrical connection of two successive conductive sections of a same wire, so as to circumvent a sub-station, for example which is faulty.

The invention claimed is:

1. A system for powering an overhead contact line, said overhead contact line including at least one contact wire comprising a plurality of conductive sections separated from each other by insulating sections, the system including a plurality of sub-stations for supplying electric power, each conductive section being connected, on a side of an upstream end of each conductive section, to an upstream sub-station via an upstream controlled switch and, on a side of a downstream end of each conductive section, to a downstream sub-station via a downstream controlled switch, each controlled switch being actuated by a corresponding control circuit, wherein the system further includes a detector associated with at least one of the plurality of conductive sections to be monitored and including a transmitter configured to apply a characteristic signal to an end from among the upstream end and the downstream end of said at least one of the plurality of conductive sections to be monitored and a receiver configured to receive the characteristic signal at the other end of said at least one of the plurality of conductive sections to be monitored, the receiver modifying a value of a state signal and applying it at least to a circuit for controlling an actuation of an opening of the downstream controlled switch and/or of the upstream controlled switch, wherein the detector of an associated conductive section to be monitored includes an upstream transceiver coupled with the upstream end and a downstream transceiver coupled with the downstream end of said conductive section to be monitored, the upstream transceiver including an upstream transmitter configured to apply a characteristic signal to the upstream end, the downstream transceiver including a downstream transmitter configured to apply a characteristic signal to the downstream end, the upstream transceiver including an upstream receiver configured to receive the characteristic signal of the downstream transceiver and to modify a value of an upstream state signal applied to an upstream control circuit for actuating the opening of the upstream controlled switch, the downstream transceiver including a downstream receiver configured to receive the characteristic signal of the upstream transceiver and to modify a value of a downstream state signal applied to a downstream control circuit for actuating the opening of the downstream controlled switch, and wherein the system further includes a controlled switch for circumventing a sub-station allowing, in a closed state, a connection together of two successive conductive sections, the state signal modified by at least one of the downstream transceiver and the upstream transceiver associated with a first conductive section being transmitted to a control circuit of a switch for connecting a second conductive section to another sub-station.

2. The system according to claim 1, wherein the upstream transceiver applies the state signal to the downstream control circuit to which it is connected through an adapted control link, and in that the downstream transceiver applies the state to the upstream control circuit to which it is connected through the adapted control link.

3. The system according to claim 1, wherein said characteristic signal applied by said downstream and upstream transceivers is a current, the downstream and upstream transceivers being coupled with the conductive section to be monitored via a capacitor so as to superpose said characteristic signal to the current of said conductive section to be monitored.

4. The system according to claim 3, wherein each characteristic signal is frequency-modulated at a characteristic frequency.

5. The system according to claim 4, wherein each of the upstream receiver and the downstream receiver includes a band pass filter centered on the characteristic frequency.

6. The system according to claim 1, including a central controller configured to collect the state signals applied to different upstream and downstream control circuits of the system in order to keep updated a representation of said system.

7. The system according to claim 1, for an overhead contact line including first and second contact wires, two conductive sections respectively belonging to the first and second wires and positioned parallel to each other, being connected in parallel between an output terminal of an upstream sub-station and an output terminal of a downstream sub-station, the system including a detector for each of said two conductive sections.

8. The system according to claim 7, wherein the upstream end and the downstream end of each of said two conductive sections are connected to a common upstream controlled switch and to a common downstream controlled switch, respectively.

* * * * *